(12) United States Patent
Kwon

(10) Patent No.: US 8,865,545 B2
(45) Date of Patent: Oct. 21, 2014

(54) SEMICONDUCTOR DEVICE AND METHOD FOR FABRICATING THE SAME

(71) Applicant: SK Hynix Inc., Icheon (KR)

(72) Inventor: Se In Kwon, Incheon (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 14/038,506

(22) Filed: Sep. 26, 2013

(65) Prior Publication Data

US 2014/0030883 A1    Jan. 30, 2014

Related U.S. Application Data

(62) Division of application No. 12/839,308, filed on Jul. 19, 2010, now Pat. No. 8,569,817.

(30) Foreign Application Priority Data

Jul. 15, 2010  (KR) .......................... 10-2010-0068371

(51) Int. Cl.
*H01L 21/8242* (2006.01)
*H01L 21/28* (2006.01)
*H01L 27/108* (2006.01)
*H01L 29/94* (2006.01)

(52) U.S. Cl.
CPC .... *H01L 21/28008* (2013.01); *H01L 27/10882* (2013.01); *H01L 27/10823* (2013.01); *H01L 27/10867* (2013.01); *H01L 27/10885* (2013.01); *H01L 27/10888* (2013.01)
USPC ........... 438/254; 438/397; 257/304; 257/305; 257/311

(58) Field of Classification Search
CPC .................. H01L 27/10885; H01L 27/10888; H01L 27/10882
USPC .................... 438/254, 397; 257/304, 305, 311
See application file for complete search history.

(56) References Cited

U.S. PATENT DOCUMENTS

| | | | |
|---|---|---|---|
| 6,563,162 B2 * | 5/2003 | Han et al. ...................... | 257/306 |
| 6,649,508 B1 * | 11/2003 | Park et al. ..................... | 438/618 |
| 6,680,511 B2 * | 1/2004 | Kim et al. ..................... | 257/332 |
| 6,709,972 B2 * | 3/2004 | Park ............................. | 438/622 |
| 8,119,512 B1 * | 2/2012 | Lee ............................... | 438/597 |
| 2004/0164328 A1 * | 8/2004 | Lee et al. ...................... | 257/213 |
| 2005/0162926 A1 * | 7/2005 | Yoo et al. .................. | 365/185.28 |

FOREIGN PATENT DOCUMENTS

| | | |
|---|---|---|
| KR | 10-1998-060531 A | 10/1998 |
| KR | 10-2003-0058635 A | 7/2003 |
| KR | 10-2004-0059805 A | 7/2004 |
| KR | 10-2008-0089999 A | 10/2008 |
| KR | 10-2009-0008034 A | 1/2009 |

* cited by examiner

*Primary Examiner* — Nicholas Tobergte

(57) ABSTRACT

A semiconductor device comprises: a semiconductor substrate including an active region defined as a device isolation film; a bit line hole disposed over the top portion of the semiconductor substrate; an oxide film disposed at sidewalls of the bit line hole; and a bit line conductive layer buried in the bit line hole including the oxide film. A bit line spacer is formed with an oxide film, thereby reducing a parasitic capacitance. A storage node contact is formed to have a line type, thereby securing a patterning margin. A storage node contact plug is formed with polysilicon having a different concentration, thereby reducing leakage current.

14 Claims, 9 Drawing Sheets

SEMICONDUCTOR DEVICE AND METHOD FOR FABRICATING THE SAME

CROSS-REFERENCE TO RELATED APPLICATION

The present application is a divisional of U.S. patent application Ser. No. 12/839,308 filed on Jul. 19, 2010, which claims priority to Korean Patent Application No. 10-2010-0068371 filed on Jul. 15, 2010, the disclosure of which are hereby incorporated in their entirety by reference.

BACKGROUND OF THE INVENTION

An embodiment of the present invention relates to a semiconductor device, and more specifically, to a semiconductor device and method for manufacturing the same including a bit line.

Recently, although a semiconductor memory device, specifically, a Dynamic Random Access Memory (DRAM), is required to have large capacity, the increase in the number of DRAM cell per a given wafer size has been limited due to a restriction in the increase of the chip size. If the chip size is increased, the number of chips per wafer is decreased and the productivity of the device is reduced. As a result, the cell layout has been recently changed to reduce the cell area and research into integrating more memory cells into one wafer has been ongoing.

In order to protect the sidewalls of a bit line, spacers including a nitride film have been widely used. However, since the nitride film has a high dielectric constant, a parasitic capacitance is increased in the bit line.

Moreover, when forming a storage node contact and a bit line, two storage node contacts are formed at one time. While a damascene process is performed to form the bit line, the storage node contact is separated into two contacts. However, when a storage node contact hole is etched, an overlay process is employed to decrease contact resistance between a storage electrode and a source region. Also, when bit line tungsten is formed by a damascene process, a tungsten etch-back process is included. In the tungsten etch-back process, polysilicon of the storage node contact plug is etched together.

BRIEF SUMMARY OF THE INVENTION

Various embodiments of the invention are directed to providing a semiconductor device and a method for fabricating the same that includes a bit line spacer formed with an oxide film to reduce a parasite capacitance, a storage node contact formed with a line type to secure a patterning margin and a storage node contact plug formed with polysilicon having a different concentration, thereby reducing leakage current.

According to an embodiment of the present invention, a semiconductor device comprises: a semiconductor substrate including an active region defined as a device isolation film; a bit line hole disposed on the top portion of the semiconductor substrate; an oxide film disposed at sidewalls of the bit line hole; and a bit line conductive layer buried in the bit line hole including the oxide film. A bit line spacer is formed with an oxide film to reduce a parasite capacitance.

The semiconductor further comprises: a storage node contact hole formed to be adjacent to the bit line hole and coupled with the semiconductor substrate; and a storage node contact plug buried in the storage node contact hole.

The storage node contact plug includes: a low concentration contact plug disposed in the bottom portion of the storage node contact hole; and a high concentration contact plug disposed in the top portion of the low concentration contact plug in the storage node contact hole, thereby reducing leakage current like GIDL.

The oxide film is disposed at sidewalls of the storage node contact plug, and the thickness of the oxide film formed in the low concentration contact plug is thicker than that of the oxide film formed in the high concentration contact plug. An etch-back process is performed on the bit line conductive layer, thereby preventing the polysilicon layer from being etched.

The storage node contact hole has a line type intersected with a bit line, thereby securing a patterning margin.

The semiconductor device further comprises a landing plug including polysilicon and disposed in the top portion of the semiconductor substrate and in the bottom portion of the bit line hole.

The semiconductor device further comprises a bit line hard mask disposed on the bit line conductive layer in the bit line hole, thereby insulating the bit line conductive layer.

The bit line conductive layer includes: a barrier metal layer formed on the surface of the bit line hole; and a conductive layer buried in the bit line hole including the barrier metal layer.

The semiconductor device further comprises a buried gate buried with a given depth in the active region and the device isolation film of the semiconductor substrate, thereby reducing a parasite capacitance of the bit line.

According to an embodiment of the present invention, a method for fabricating a semiconductor device comprises: forming a device isolation film that defines an active region in a semiconductor substrate; forming a bit line hole on the top portion of the semiconductor substrate; forming an oxide film at sidewalls of the bit line hole; and burying a bit line conductive layer in the bit line hole including the oxide film. A bit line spacer is formed with an oxide film to reduce a parasite capacitance.

The forming-an-oxide-film-at-sidewalls-of-the-bit-line-hole includes performing a dry oxidation process or a radical oxidation process.

After forming an oxide film at sidewalls of the bit line hole, the method further comprises performing an etch-back process on the bit line hole to remove the oxide film disposed in the bottom of the bit line hole, thereby exposing a landing plug disposed in the bottom of the bit line hole.

Before forming a bit line hole, the method further comprises forming a storage node contact plug on the top portion of the semiconductor substrate.

The forming-a-bit-line-hole is performed to separate the storage node contact plug, thereby improving a patterning margin.

The forming-a-storage-node-contact-plug includes: forming a storage node contact hole that exposes the semiconductor substrate; burying polysilicon in the storage node contact hole; performing a low concentration ion-implanting process on the polysilicon to form a low concentration polysilicon layer; and performing a high concentration ion-implanting process on the polysilicon to form a high concentration polysilicon layer.

The forming-a-storage-node-contact-plug includes: forming a storage node contact hole that exposes the semiconductor substrate: burying polysilicon in the bottom portion of the storage node contact hole; performing a low concentration ion-implanting process on the polysilicon to form a low concentration polysilicon layer; burying polysilicon in the top portion of the low concentration polysilicon layer; and performing a high concentration ion-implanting process on the polysilicon to form a high concentration polysilicon layer in the top portion of the low concentration polysilicon layer.

The forming-an-oxide-film-at-sidewalls-of-the-bit-line includes oxidizing sidewalls of the storage node contact plug, and the thickness of the oxide film of the low concentration polysilicon layer is thicker than that of the oxide film of the high concentration polysilicon layer. In the etch-back process of the bit line conductive layer, the polysilicon layer is required to be protected.

The storage node contact hole is formed to have a line type intersected with the bit line, thereby securing a patterning margin.

After forming a bit line conductive layer, the method further comprises forming a bit line hard mask on the top portion of the bit line conductive layer in the bit line hole, thereby protecting the bit line conductive layer.

The forming-a-bit-line-conductive-layer includes: forming a barrier metal layer on the surface of the bit line hole; and burying a conductive layer in the bit line hole including the barrier metal layer.

Before forming a bit line hole, the method further comprises forming a buried gate in the semiconductor substrate of the cell region.

DESCRIPTION OF EMBODIMENTS

The present invention will be described in detail with reference to the attached drawings.

Figure 1:
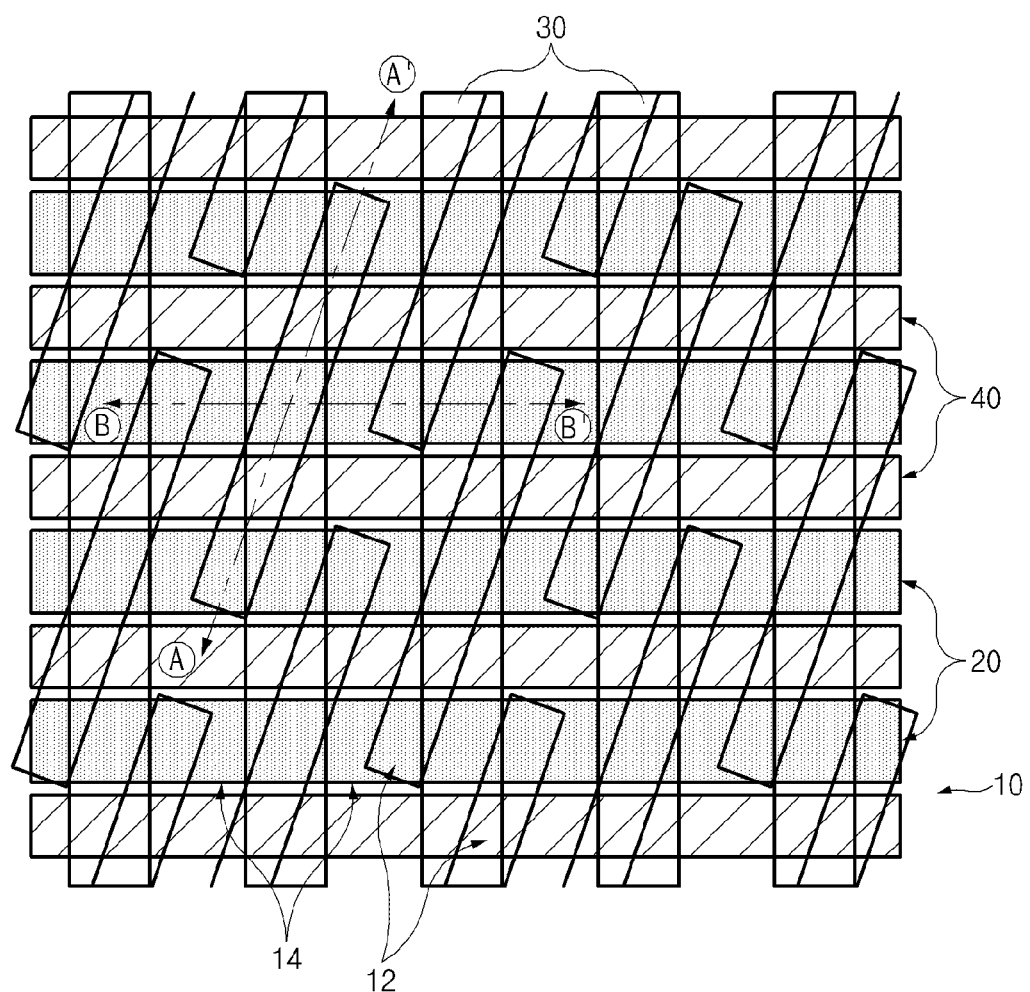
FIG. 1 is a plan view illustrating a semiconductor device according to an embodiment of the present invention.

FIG. 1 is a plan view illustrating a semiconductor device according to an embodiment of the present invention.

Referring to FIG. 1, a device isolation film 14 that defines an active region 12 is disposed in a semiconductor substrate 10. A gate 40 formed passing over the active region 12 along a horizontal direction. A bit line 30 is formed passing over the active region 12 along a vertical direction. Along a direction parallel to the gate 40, a storage node contact 20 having a line type is disposed in a space between the adjacent gates 40.

The gate 40 is a buried gate buried in a recess defined in the semiconductor substrate 10. The bit line 30 is formed by a damascene process. In the damascene process, the storage node contacts 20 are separated from each other.

FIGS. 2 to 9 are cross-sectional diagrams illustrating a method for fabricating a semiconductor device according to an embodiment of the present invention. In FIGS. 2 to 9, (a) is a cross-sectional diagram taken along A-A' of FIG. 1, and (b) is a cross-sectional diagram taken along B-B' of FIG. 1.

Figure 2:
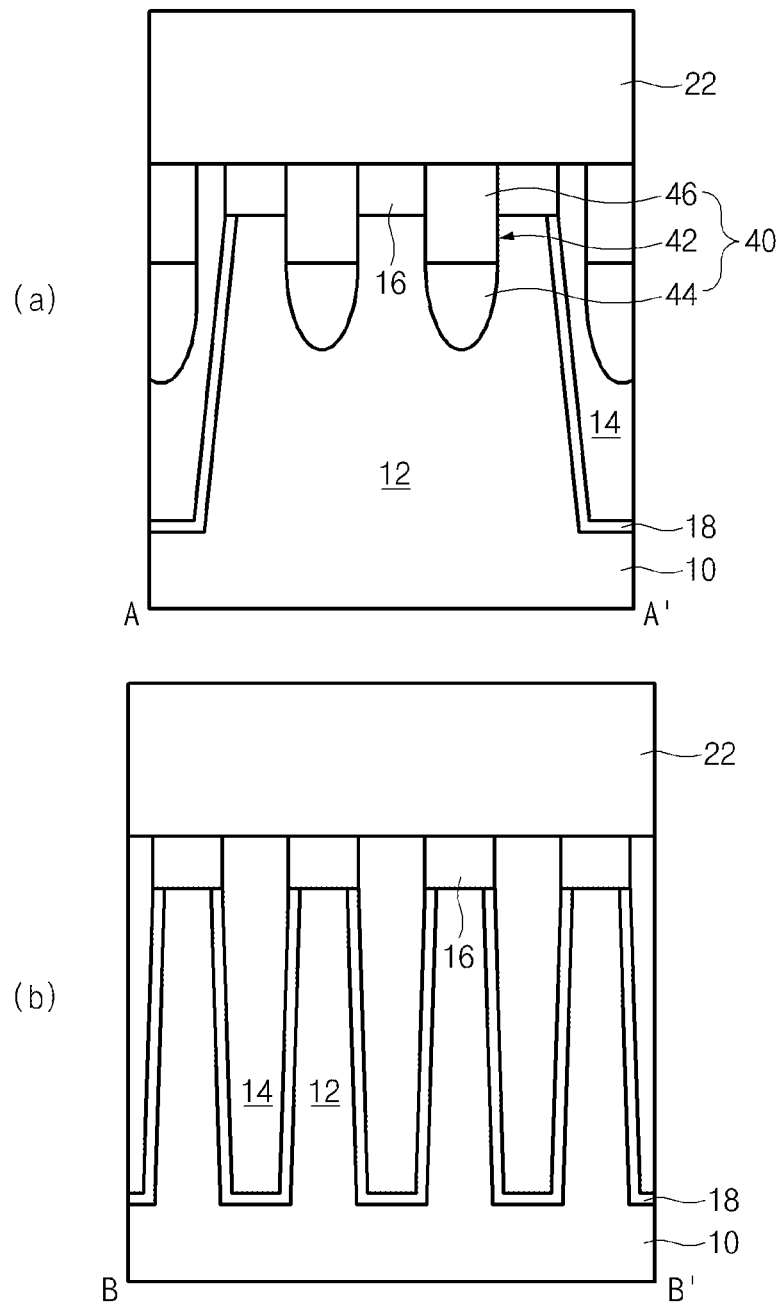
FIGS. 2 to 9 are cross-sectional diagrams illustrating a method for fabricating a semiconductor device according to an embodiment of the present invention.

Referring to FIG. 2, the device isolation film 14 that defines the active region 12 is formed in the semiconductor substrate 10. In order to form the device isolation film 14, after a trench is formed in the semiconductor substrate 10 (e.g., a Shallow Trench Isolation (STI) process), the trench is filled with an insulating film such as an oxide film, thereby obtaining the device isolation film 14. The device isolation film 14 may include an oxide film. On an interface surface between the substrate 10 and the device isolation film 14, a liner layer 18 including an oxide film or a nitride film may be additionally formed.

A buried gate 40 is formed in the semiconductor substrate 10. After a hard mask (not shown) that defines a recess region is formed in the active region 12 and the device isolation film 14 of the semiconductor substrate 10, the active region 12 and the device isolation film 14 are etched with the hard mask to form a recess 42 having a given depth. A gate electrode 44 material is buried in the bottom portion of the recess 42, and a capping layer 46 is buried in the top portion thereof to insulate the gate electrode 44. The gate electrode 44 includes any metal such as tungsten (W), titanium (Ti), titanium nitride (TIN) and polysilicon. The capping film 46 includes a nitride film and an oxide film. When the buried gate is formed, the parasitic capacitance can be effectively reduced between the bit line and the gates.

After the hard mask (not shown) is removed, a landing plug 16 is formed in a space where the hard mask is removed. The landing plug 16 may include a conductive material such as polysilicon. An interlayer dielectric film 22 is formed on the top portion of the semiconductor substrate 10 including the buried gate 40 and the landing plug 16. The interlayer dielectric film 22 includes an oxide film.

Figure 3:
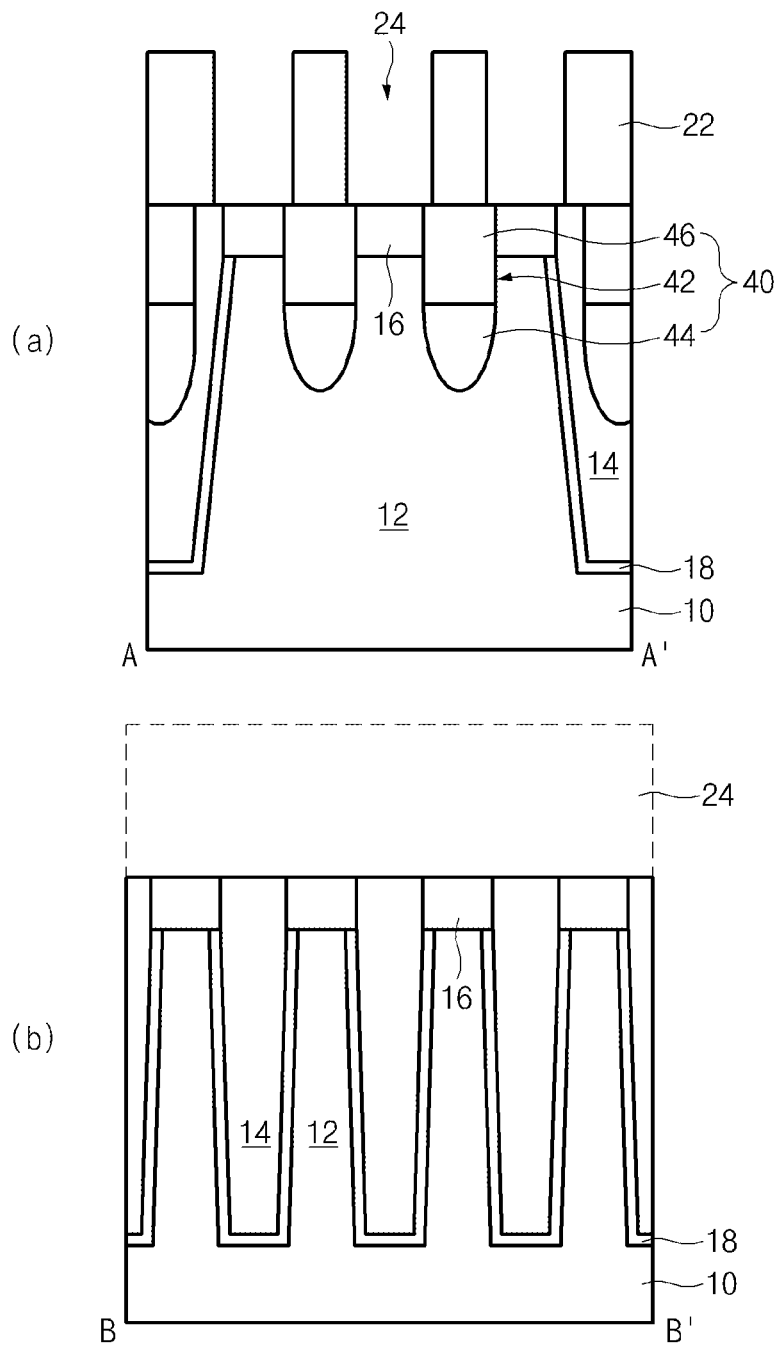

As shown in (a) of FIG. 3, the interlayer insulating film 22 is etched to form a storage node contact trench 24 that exposes the top portion of the landing plug 16. As shown in (b) of FIG. 3, the storage node contact trench 24 (a line type trench) is formed extending along the gate 40, as more clearly shown in FIG. 1. The storage node contact trench 24 extends along a first direction in a line pattern. In an embodiment, the storage node contact trench 24 extends in parallel to the gate 40. As a result, an overlay margin is improved compared with a conventional isolated hole-type storage node contact hole. Also, in the conventional art, the bottom landing plug 16 would not be exposed.

Figure 4:
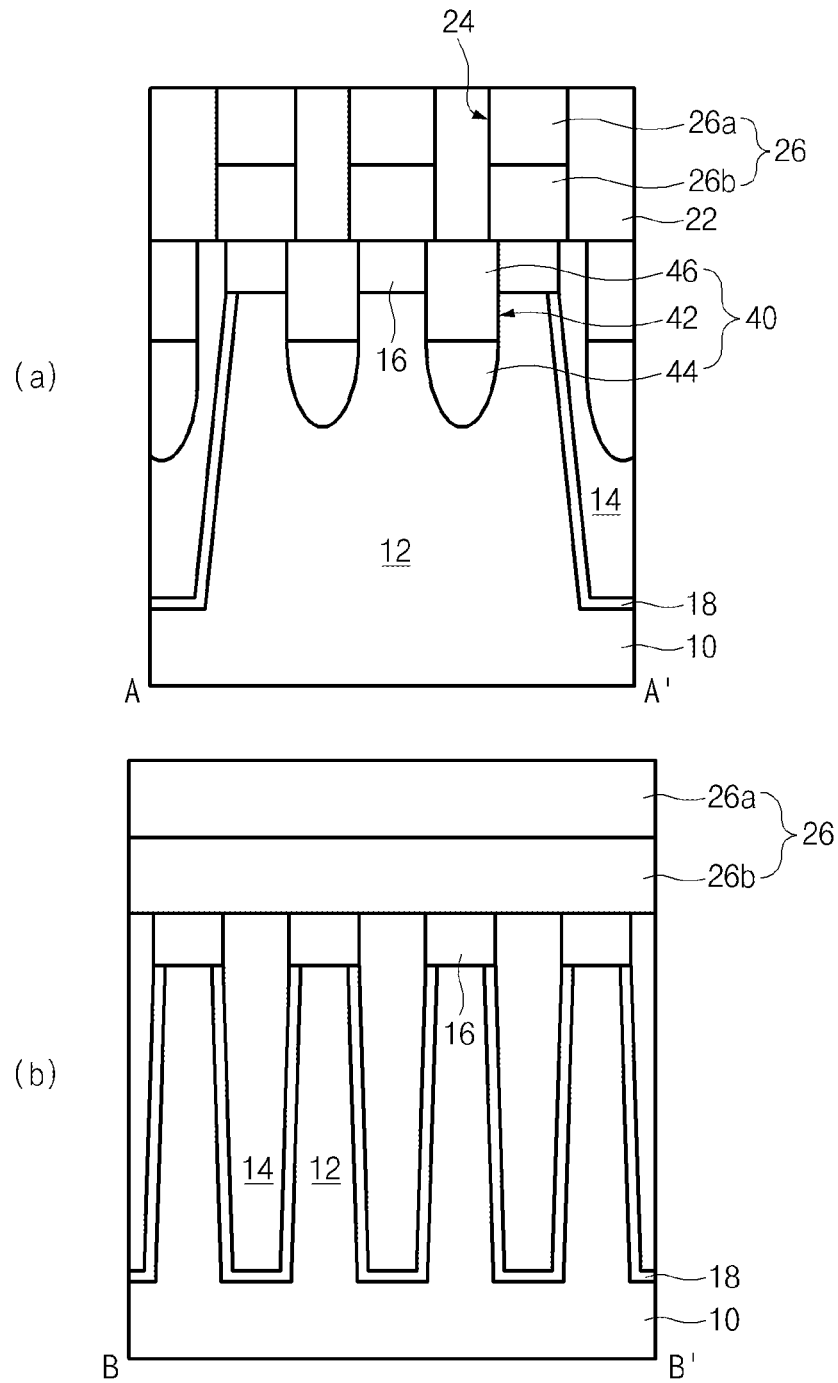

Referring to FIG. 4, a storage node contact plug 26 that buries the storage node contact hole 24 is formed. The storage node contact plug 26 includes conductive material, e.g., polysilicon. In an embodiment, the storage node contact plug 26 is formed only using polysilicon. For example, the storage node contact plug 26 may include a first polysilicon layer 26b and a second polysilicon layer 26a that have different dopant concentration levels. In an embodiment, the second polysilicon layer 26a that is proximate the substrate has a relatively high dopant concentration level, and the first polysilicon layer 26b that is provided on the second polysilicon layer 26a has a relatively low dopant concentration level.

Several alternative processes are available to form the first and second polysilicon layers 26a and 26b having different ion-implantation concentrations (or dopant concentrations). The following is one example: (i) After a polysilicon layer is buried in the storage node contact hole 24, a low concentration ion-implanting process is performed to convert the whole polysilicon into the lightly doped polysilicon layer. Next, a high concentration ion-implanting process is additionally performed to convert an upper portion of the lightly doped polysilicon layer into the highly doped polysilicon layer. (ii) After a polysilicon layer fills up the bottom portion of the storage node contact hole 24, a low concentration ion-implanting process is performed to form the lightly doped polysilicon layer 26b. Then, another polysilicon layer fills up the top portion of the storage node contact hole 24, and a high-concentration ion-implanting process is performed to form the highly doped polysilicon layer 26a on the lightly doped polysilicon layer 26b.

When the storage node contact plug 26 is formed with a multi-layer polysilicon (each layer of which has a different ion-implantation concentration from another layer), the leakage current such as Gate Induced Drain Leakage (GIDL) can be reduced since the ion concentration of the bottom portion (low concentration polysilicon layer) of the storage node contact plug 26 that is close to the junction region is low. Also, in a subsequent oxidation process performed onto the inner surface of the bit line hole, oxide films over the inner surface of the bit line hole can be formed with different thicknesses depending on an elevation level, thereby the storage node contact plug 26 can be protected from attack during an etch-back process on the bit line conductive layer. (see FIG. 6)

Figure 5:
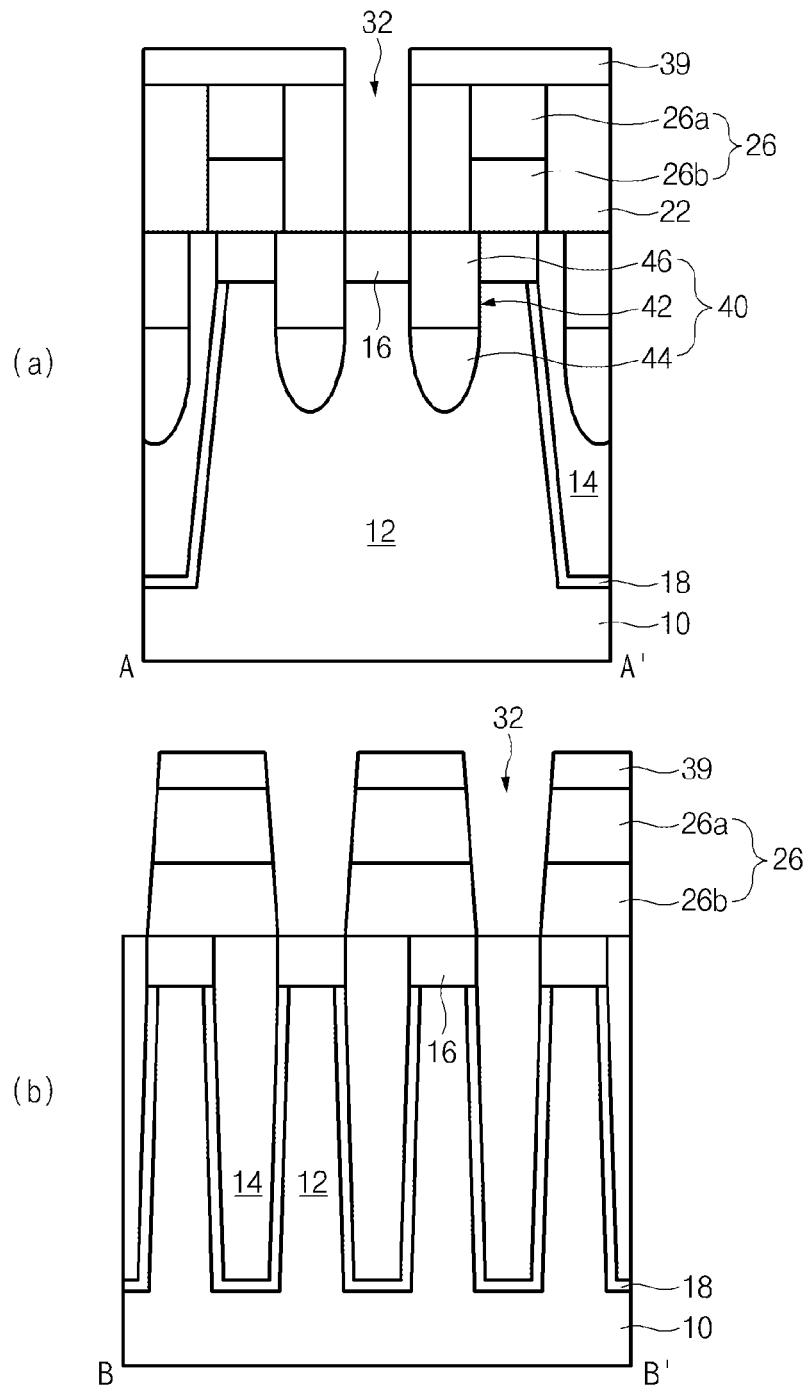

Referring to FIG. 5, an etch mask pattern 39 including a material such as a nitride film is formed on the top portion of the interlayer insulating film 22. The storage node contact plug 26 and the interlayer insulating film 22 are etched with the etch mask pattern 39 as a mask, thereby forming a bit line hole 32. As shown in (b) of FIG. 5, the bit line hole 32 is formed to expose the landing plug 16 or the device isolation film 14. The bit line hole 32 is used to form a bit line by a damascene process, and makes the storage node contact plug 26 in a line type self-patterned so that two storage node contact plugs 26 may be formed in one active region 12 (see FIG. 1).

In an etch process for forming the bit line hole 32 that exposes the landing plug 16 in (b) of FIG. 5, the storage node contact plug 26 including polysilicon may not be sufficiently etched away from the bit line hole 32 but residuals may remain over the landing plug 16. In this case, when an oxidation process is performed onto the bit line hole 32 to convert the residual polysilicon into $SiO_2$, the oxidized residual polysilicon can be easily removed by an additional etch. Thus the storage node contact plug 26 can be completely separated from a neighboring storage node contact plug 26.

Figure 6:
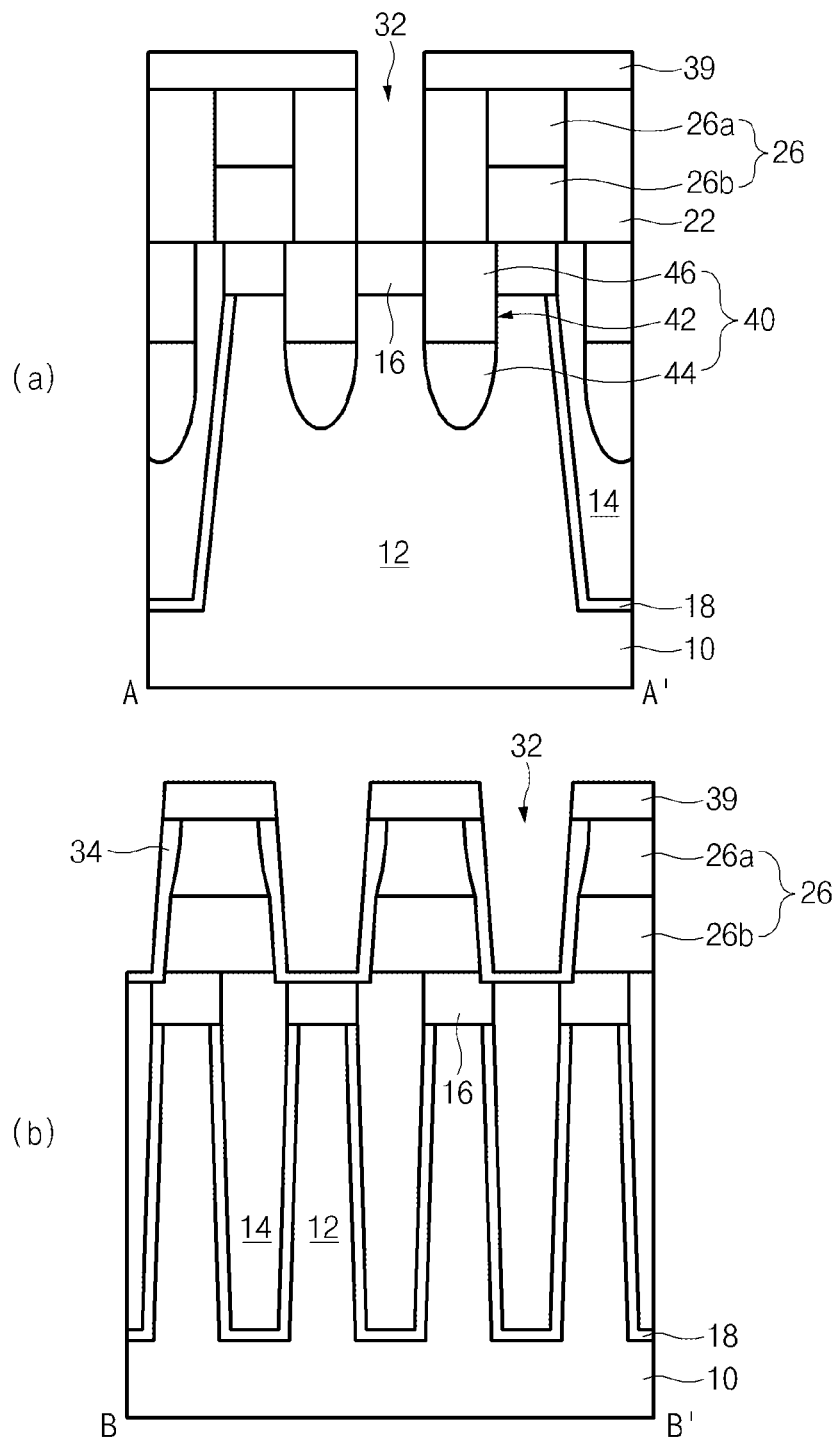

Referring to FIG. 6, an oxidation process is performed on the bit line hole 32. The oxidation process may be formed by a dry oxidation process or a radical oxidation process. When the dry oxidation process is performed, an oxide film 34 may be formed to have a different thickness, respectively, at the top portion and at the bottom portion as shown in (b) of FIG. 6. The different thickness is because oxidation occurs easily at the highly doped polysilicon layer 26a than at the lightly doped polysilicon layer 26b. As shown in (b) of FIG. 6, the oxide film 34 is formed to be thicker at the inner sidewall of the highly doped polysilicon layer 26a. In an embodiment, the oxide film 34 has a thickness of 80 Å to 90 Å proximate the highly doped polysilicon layer 26a and a thickness of 60 Å to 80 Å proximate the lightly doped polysilicon layer 26b.

The oxide film 34 formed by the oxidation process serves as an insulator for insulating between the bit line 30 (see FIG. 9) and the storage node contact plug 26, between two neighboring storage node contact plugs 26, and between the storage node contact plug 26 and the landing plug 16 for a bit line. Additionally, the oxide film 34 serves as a protector for protecting the side surface of the bit line from being attacked in a subsequent process, like a nitride film formed as a spacer at the side surface of the bit line in the prior art. Since an oxide film as a spacer has better properties than a nitride film, the parasitic capacitance of the bit line can be reduced. In an embodiment, the spacer for the bit line includes oxide and is free of nitride. In another embodiment, the spacer for the bit line consists essentially of oxide.

Figure 7:
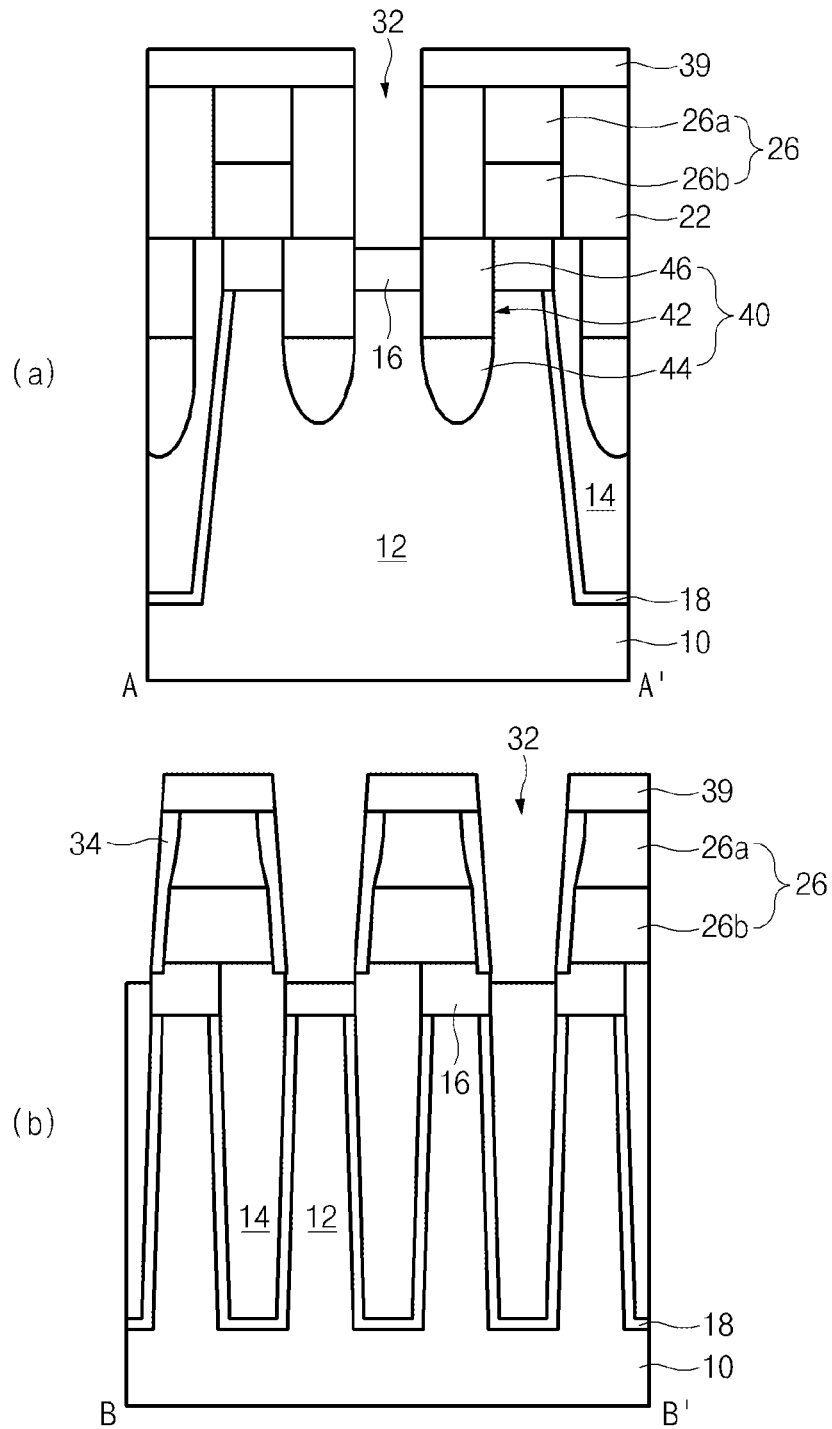

Referring to FIG. 7, before forming a bit line, the oxide film 34 disposed in the bottom portion of the bit line hole 32 is removed by an etch-back process to expose the landing plug 16 for a bit line.

Figure 8:
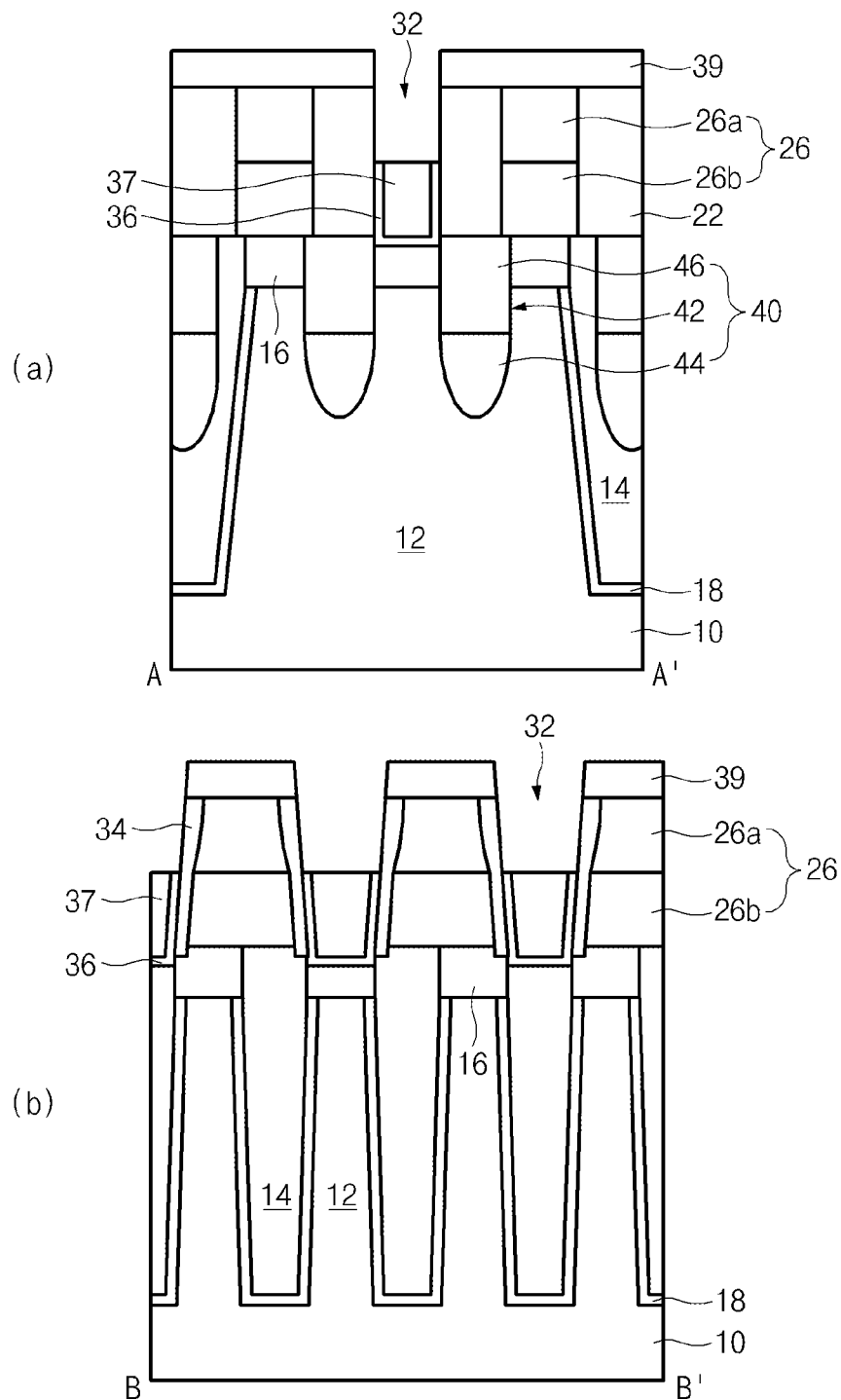

Referring to FIG. 8, a barrier metal layer 36 and a bit line conductive layer 37 are formed on the inside of the bit line hole 32. The barrier metal layer 36 can have a stacked structure including Ti and TiN, and the bit line conductive layer 37 can include W. In the process of forming the bit line conductive layer 37, after the bit line conductive layer 37 is deposited to fill the bit line hole 32, the bit line conductive layer 37 is removed by an etch-back process so that the bit line conductive layer 37 remains only on the bottom portion of the bit line hole 32. Since the thick oxide film 34 remains on the top portion of the bit line hole 32, the storage node contact plug 26 can be protected from attack in the etch-back process. That is, the oxide film 34 protects the sidewall of the storage node contact plug 26.

Figure 9:
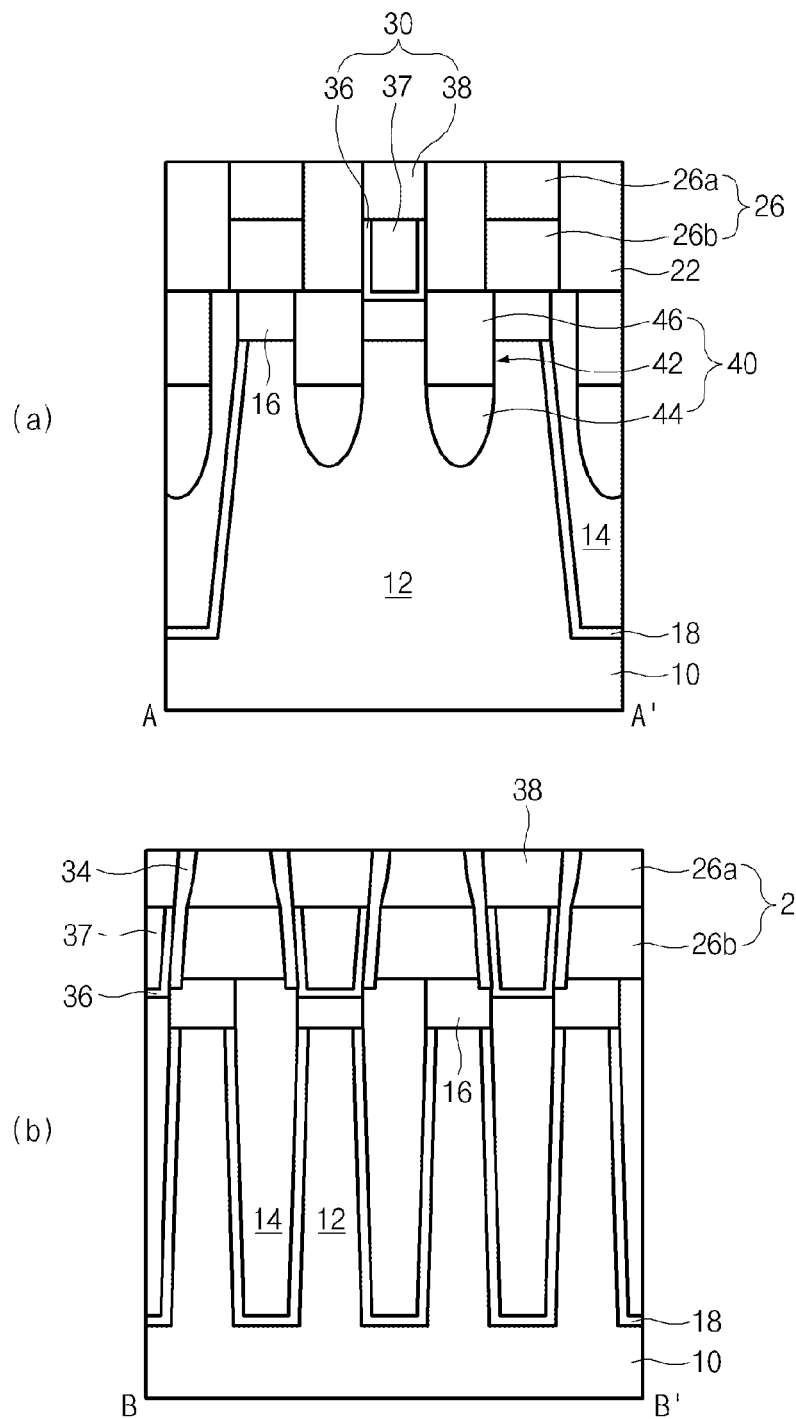

Referring to FIG. 9, a bit line hard mask 38 is formed on the top portion of the bit line conductive layer 37 in the bit line hole 32 so as to protect the top portion of the bit line conductive layer 37. The bit line hard mask 38 includes a nitride film. The semiconductor device fabricated by this method according to an embodiment of the present invention includes the oxide film 34 spacer formed at the sidewalls of the bit line hole 32.

Although it is not shown, a capacitor is formed on the top portion of the storage node contact plug separated by the bit line 30, and a metal line is also formed, thereby obtaining a semiconductor device.

As described above, since the semiconductor device fabricated by this method according to an embodiment of the present invention includes a bit line spacer formed of an oxide film, parasitic capacitance can be more effectively reduced compared with using a nitride film. Employment of a nitride film as a bit line spacer is applicable because the storage node contact hole is formed in a line type rather than a hole type which is surrounded by an interlayer insulating film. Accordingly, since no interlayer insulating film 22 consisting of oxide material is present between the storage node plug 26 and the bit line contact hole 32, the bit line spacer 34 can be formed of oxide material. See FIGS. 5(b) and 6(b). Furthermore, the storage node contact trench is formed in a line pattern rather than a conventional hole pattern. See FIG. 3(b). Thus, a sufficient patterning margin can be secured in both processes of forming the storage node contact trench 24 and in forming the bit line hole 32. Additionally, the bit line spacer 34 including oxide material can be configured to have an uneven or tapered thickness depending on an elevation level. See FIG. 6(b). For example, the thickness of the bit line spacer 34 can be tapered down from the top portion toward the bottom. This configuration is advantageous in preventing the storage node contact plug 26 from being attacked during the process of forming the bit line contact hole 32, and also advantageous in lowering electric resistance between the storage node landing plug 16 and the storage node contact plug 26. Also, the storage node landing plug 16 can be formed of a multi-layer where a lower layer is formed of material causing lesser leakage than an upper layer, thereby reducing leakage current.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for fabricating a semiconductor device, the method comprising:
   forming a device isolation film that defines an active region in a semiconductor substrate;

forming a storage node contact trench over the semiconductor substrate;

forming a storage node contact layer over the semiconductor substrate within the storage node contact trench;

forming a bit line hole over the semiconductor substrate, the storage node contact layer being separated into a plurality of storage node contact plugs by the bit line hole;

forming an oxide film at sidewalls of the bit line hole; and forming a bit line conductive layer filling the bit line hole including the oxide film.

2. The method according to claim 1, wherein the step of forming-an-oxide-film-at-sidewalls-of-the-bit-line-hole is performed by a dry oxidation process or a radical oxidation process.

3. The method according to claim 1, further comprising performing an etch-back process on the bit line hole to remove the oxide film disposed over a lower portion of the bit line hole.

4. The method according to claim 1, wherein the forming-a-bit-line-hole step is performed to separate the storage node contact layer to be self-patterned into the plurality of storage node contact plugs which are electrically separated from each other.

5. The method according to claim 1, wherein the storage node contact layer includes polysilicon, the method further comprising:

implanting ions into the polysilicon to form a lightly doped polysilicon layer; and implanting ions into the polysilicon to form a highly doped polysilicon layer that is provided over the lightly doped polysilicon layer.

6. The method according to claim 1, wherein the storage node contact layer includes polysilicon, the method further comprising:

forming a first polysilicon layer in a lower portion of the storage node contact trench;

implanting ions into the first polysilicon layer to form a lightly doped polysilicon layer;

forming a second polysilicon over the first polysilicon layer; and implanting ions into the second polysilicon layer to form a highly doped polysilicon layer.

7. The method according to claim 1, wherein the step of forming-an-oxide-film-at-sidewalls-of-the-bit-line includes oxidizing sidewalls of the storage node contact plug to form an oxide film at sidewalls of the storage node contact plug, wherein the thickness of the oxide film proximate the lightly doped polysilicon layer is thicker than that of the oxide film proximate the highly doped polysilicon layer.

8. The method according to claim 1, wherein the oxide film defines a spacer that isolates the bit line conductive layer formed within the bit line hole from the storage node contact plug, the spacer being free of nitride.

9. The method according to claim 1, after forming the bit line conductive layer, further comprising forming a bit line hard mask over the bit line conductive layer in the bit line hole.

10. The method according to claim 1, wherein the step of forming-a-bit-line-conductive-layer includes:

forming a barrier metal layer over the inner surface of the bit line hole; and forming a conductive layer in the bit line hole including the barrier metal layer.

11. The method according to claim 1, further comprising forming a buried gate in the semiconductor substrate of a cell region before forming the bit line hole.

12. The method according to claim 1, further comprising forming a storage node contact trench that exposes the semiconductor substrate, the storage node contact trench extending along a direction to define a line pattern.

13. A method for forming a semiconductor device comprising:

forming a first and a second active regions in a substrate, the first and the second active regions being electrically insulated by a device isolation region;

forming a first and a second source/drain regions in the first and the second active regions, respectively, the first and the second source/drain regions being electrically insulated by the device isolation region;

forming an insulating layer over the first and the second active regions and the device isolation region;

patterning the insulating layer to form a first trench in a continuous line pattern directly or indirectly exposing the first and the second source/drain regions and the device isolation region;

forming a conductive layer filling the first trench;

patterning the conductive layer to form a second trench directly or indirectly exposing the second source/drain region in such a manner that the first conductive layer in a continuous line pattern is converted into a storage node contact plug in an isolated island pattern, the storage node contact plug being electrically coupled to the first source/drain pattern;

forming a spacer over a sidewall of the second trench; and forming a bit line contact plug filling the second trench, the spacer separating the bit line contact plug and the storage node contact plug.

14. The method according to claim 13, wherein the spacer includes oxide and free of nitride.

* * * * *